United States Patent
Hamren et al.

(10) Patent No.: US 7,122,389 B2
(45) Date of Patent: Oct. 17, 2006

(54) METHOD FOR PROCESSING SEMICONDUCTOR DEVICES IN A SINGULATED FORM

(75) Inventors: Steven L. Hamren, Boise, ID (US); Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/920,014

(22) Filed: Aug. 16, 2004

(65) Prior Publication Data
US 2005/0014301 A1    Jan. 20, 2005

Related U.S. Application Data

(62) Division of application No. 10/422,417, filed on Apr. 23, 2003.

(51) Int. Cl.
*G01R 31/26* (2006.01)
(52) U.S. Cl. .................. 438/18; 257/E21.52; 257/1
(58) Field of Classification Search ........ 252/511–514, 252/787, 789, 793; 438/14, 15, 17, 18
See application file for complete search history.

(56) References Cited

U.S. PATENT DOCUMENTS

| | | | |
|---|---|---|---|
| 4,811,081 A | 3/1989 | Lyden | |
| 4,949,148 A | 8/1990 | Bartelink | |
| 5,302,891 A | 4/1994 | Wood et al. | |
| 5,367,253 A | 11/1994 | Wood et al. | |
| 5,474,458 A | 12/1995 | Vafi et al. | |
| 5,495,179 A | 2/1996 | Wood et al. | |
| 5,517,125 A | 5/1996 | Posedel et al. | |
| 5,519,332 A | 5/1996 | Wood et al. | |
| 5,532,612 A | 7/1996 | Liang | |
| 5,536,362 A | 7/1996 | Love et al. | |
| 5,661,042 A | 8/1997 | Fang et al. | |
| 5,678,301 A | 10/1997 | Gochnour et al. | |
| 5,691,649 A | 11/1997 | Farnworth et al. | |
| 5,767,689 A | 6/1998 | Tokuno et al. | |
| 5,789,930 A * | 8/1998 | Isaacs et al. ............... 324/754 |
| 5,841,194 A | 11/1998 | Tsukamoto | |

(Continued)

FOREIGN PATENT DOCUMENTS

JP    05190015    *    7/1993

OTHER PUBLICATIONS

Nibbe, Robert, "Material Safety Data Sheet", Apr. 5, 2001, 2 pages, Concrete Devices Inc., Hunington Beach, CA.

(Continued)

*Primary Examiner*—Asok Kumar Sarkar
(74) *Attorney, Agent, or Firm*—TraskBritt, PC

(57) ABSTRACT

Improved methods and apparatus are provided for the handling and testing of semiconductor devices. One embodiment comprises a die carrier for one or more semiconductor dice having very fine pitch electrical I/O (input/output) elements. The semiconductor dice are temporarily attached to the die carrier in singulated form to enable testing the dice with conventional contact technology. The die carrier may include a flex circuit base substrate and a rigid support frame. Further embodiments comprise materials and methods for attaching the semiconductor dice to the die carrier and for providing a temporary electrical connection with the semiconductor dice during testing. Exemplary materials for providing the temporary electrical connection may comprise a conductive film or tape, a conductive or conductor-filled epoxy, resin or RTV adhesive-based materials, a water-soluble material impregnated with a conductive filler or non-reflowed solder paste.

9 Claims, 6 Drawing Sheets

U.S. PATENT DOCUMENTS

| | | |
|---|---|---|
| 5,866,943 A | 2/1999 | Mertol |
| 5,905,633 A | 5/1999 | Shim et al. |
| 6,069,023 A | 5/2000 | Bernier et al. |
| 6,081,429 A | 6/2000 | Barrett |
| 6,094,058 A | 7/2000 | Hembree et al. |
| 6,214,640 B1 | 4/2001 | Fosberry et al. |
| 6,222,379 B1 | 4/2001 | Farnworth et al. |
| 6,278,286 B1 | 8/2001 | Farnworth et al. |
| 6,284,569 B1 | 9/2001 | Sheppard et al. |
| 6,329,832 B1 * | 12/2001 | Cobbley et al. ............ 324/765 |
| 6,501,291 B1 | 12/2002 | Shen |
| 6,529,145 B1 | 3/2003 | Lin |
| 6,607,942 B1 | 8/2003 | Tsao et al. |
| 6,791,195 B1 | 9/2004 | Urushima |
| 2004/0082108 A1 * | 4/2004 | Thomas et al. ............ 438/108 |

OTHER PUBLICATIONS

"Material Safety Date Sheet", Aug. 31, 2001, 6 pages, Kester Solder, Des Plaines, IL.

* cited by examiner

METHOD FOR PROCESSING SEMICONDUCTOR DEVICES IN A SINGULATED FORM

CROSS-REFERENCE TO RELATED APPLICATION

This application is a divisional of application Ser. No. 10/422,417, filed Apr. 23, 2003, pending.

BACKGROUND OF THE INVENTION

1. Field of the Invention

The present invention relates generally to the handling of semiconductor devices during processing. More particularly, the present invention relates to a die carrier for one or more semiconductor dice having very fine pitch electrical I/O (input/output) elements. The semiconductor dice are temporarily attached to the die carrier in singulated form to allow testing the dice with standard contact technology. The present invention further relates to materials and methods for temporarily attaching the dice to the die carrier.

2. State of the Art

In semiconductor manufacturing, it is highly desirable to test semiconductor devices for functionality prior to packaging or mounting of the devices to higher-level assemblies. By doing so, defective devices can be identified and eliminated without unnecessarily providing them with further processing.

A common method for testing semiconductor devices during processing comprises forming temporary electrical connections to the device I/O elements with pin-type contact probes. Probe testing has been conventionally carried out, for example, while a plurality of semiconductor devices are still contained within a wafer. With this process, a matrix of contact probes carried by a test contactor substrate is forced against the I/O elements (e.g., bond pads or conductive bumps) of the semiconductor devices in the wafer, and a brief test is conducted to determine the functionality of each device. The wafer is subsequently singulated to provide individual semiconductor dice. Any dice containing non-functional integrated circuits are scrapped, routed for rework if possible, or binned into a category not requiring full functionality for less demanding applications. The remaining dice are passed on to further processing for packaging or attaching the dice to higher-level assemblies. By using this method, semiconductor devices may be tested without substantially slowing down the manufacturing process.

Probe testing of semiconductor devices at the wafer level, however, is typically capable of providing only a minimal measure of functionality and does not ensure that the devices will operate suitably after final processing in die form. Further, defective devices may induce undetectable failures in adjacent devices by testing them while coexistent on a wafer, or devices may be damaged during wafer singulation. Accordingly, the dice must be tested again after being packaged or otherwise incorporated into higher-level assemblies. Processing unusable semiconductor dice to this point, only to scrap them after testing, results in a waste of production time and materials. Furthermore, as semiconductor device geometries shrink, the I/O elements of a die become more difficult to contact and test due to tighter alignment tolerances and the need to use smaller, more fragile contact probes.

In order to address the problems associated with testing semiconductor devices at the wafer level, manufacturers have developed methods for testing of individual, unpackaged semiconductor dice. The methods often employ temporary die carriers to hold one or more individual dice and prevent damage during testing. A prior art die carrier typically comprises a base portion with a cavity for housing a die and providing an electrical connection to external test circuitry. A die is placed in the cavity circuit side down, and the die I/0 elements are biased against an array of interconnects in communication with conductive elements on the exterior of the carrier. The interconnects may take the form of bumps, pins or simple pads forming a land-grid array (LGA), depending on whether the die I/O elements are bond pads, or include structures such as conductive bumps added for subsequent flip-chip or TAB (tape-automated-bonding) type circuit connection. Biasing the I/O elements against the interconnects is achieved through the use of lids, clips or springs that are attached to the base portion and press on the die. Once the die is secured, the carrier is pressed into a test socket to connect the carrier conductive elements to the external test circuitry.

Prior art die carriers of the type discussed above are disclosed in U.S. Pat. No. 5,367,253 to Wood et al., U.S. Pat. No. 5,517,125 to Posedel et al., U.S. Pat. No. 5,767,689 to Tokuno et al. and U.S. Pat. No. 6,278,286 to Farnworth et al. Although these die carriers overcome some of the problems associated with testing at the wafer level, they raise other issues which are undesirable in the context of semiconductor processing. Due to their complex structure, existing die carriers may be expensive to fabricate and include features susceptible to damage during use. Interconnects in the form of bumps or pins, for instance, may be damaged or worn down by repetitive biasing against die I/O elements, especially when the interconnects are of a small size suitable for interfacing with very fine pitch I/O elements. Likewise, the carrier conductive elements, which may comprise pins or lead-like structures, may be damaged during insertion into a test socket and do not offer the efficiency of probe-type testing. Furthermore, the lids, clips and springs used to press on a die add cumbersome manual operations to the manufacturing process.

In view of the present state of the art, there exists a need for a die carrier having a durable, yet simple construction and that uses an improved method for temporarily attaching one or more semiconductor dice to its interconnects.

BRIEF SUMMARY OF THE INVENTION

The present invention overcomes the deficiencies of the prior art with a die carrier that is capable of holding and protecting one or more semiconductor dice without requiring complex or expensive structural features. The die carrier enables the use of efficient contact-probe-type testing, without the drawbacks of testing at the wafer level. In its basic form, the die carrier comprises a planar base substrate having a pattern of conductive traces with attachment pads corresponding to the I/O elements of a die. The traces fan out from the I/O elements to contact pads that are spaced to interface with a conventional matrix of contact probes. The die carrier of the present invention does not require additional structures to hold a die in place and bias it against the attachment pads. Instead, a die is temporarily attached to the die carrier by an electrically conductive adhesive material placed over the I/O elements on the face of the die. Individual semiconductor dice may thereby be tested for functionality without unduly adding to the cost or complexity of processing.

In one exemplary embodiment of the die carrier of the present invention, the base substrate of the die carrier comprises a flex circuit. Flex circuits, as known in the art, typically comprise one or more sheets of polyimide or polyester material having thin, foil-like traces of metal, alloys, or other conductive materials formed on the surfaces of the sheets. This construction allows a flex circuit to bend or twist without being damaged, unlike more rigid conventional laminated circuit boards. Flex circuits, at least when formed with two circuit layers or less, are also less expensive to produce than conventional laminated circuit boards. The low cost associated with fabricating a flex circuit makes it desirable for use as a base substrate for the die carrier. Furthermore, the pliant nature of a flex circuit allows it to yield when forced against contact probes. This characteristic reduces stress on the test equipment and improves the electrical connection with I/O elements by pressing the flex circuit towards an attached die.

In a further embodiment of the die carrier of the present invention, a support frame is secured to the die-side surface of the base substrate. The support frame comprises a planar substrate having at least one aperture for exposing the attachment pad area of the die carrier and at least partially surrounding the sides of an attached die. By surrounding an adhesively attached die, the support frame helps to prevent the die from being damaged or inadvertently knocked off the die carrier during handling. When using a flex circuit as a base substrate, the support frame adds rigidity to the die carrier while still allowing the flex circuit to yield under the attachment pad areas. The support frame may be secured to the die carrier with an adhesive, by press-fit elements, or by any other suitable means as known in the art.

Mechanical alignment features may further be included on the die carrier to aid in aligning the die carrier with a matrix of contact probes. According to one embodiment of the present invention, the alignment features comprise apertures or notches formed through the base substrate, the support frame of the die carrier, or both.

Additional embodiments of the present invention are directed to the adhesive materials and methods used for temporarily attaching a die to the die carrier.

In one exemplary embodiment of the present invention, the adhesive material comprises an electrically conductive adhesive tape applied to the die-side surface of the die carrier over the attachment pads. A die is placed in a facedown orientation on the tape and is thereby attached to the die carrier. The conductive properties of the tape provide an electrical connection between the I/O elements on the die and the die carrier attachment pads. After the completion of testing, the die may be removed from the die carrier by simply pulling it off the tape. Suitable conductive adhesive tapes are known in the art and typically function by anisotropic, or z-axis, conduction between the sides of the tape. The tape may further comprise a pressure-sensitive adhesive tape, which only conducts transverse to the plane of the tape when pressure is applied. This may be desirable when the base substrate of the die carrier comprises a flex circuit that is pressed against an attached die during testing.

In another exemplary embodiment of the present invention, the adhesive material comprises an electrically conductive liquid, gel or paste that is applied to the die carrier attachment pads. The material may comprise, for example, a conductive or conductor-filled epoxy, resin or room temperature vulcanized (RTV) silicon or similar material. In some instances, a die may be bonded to the die carrier by curing the epoxy, resin, or RTV adhesive and then using a solvent or deactivating agent to break the bond after the completion of testing. Alternatively, if the epoxy, resin or RTV adhesive material provided sufficient adhesion in an uncured or partially cured (B-stage) state, a die may simply be held in place without complete curing. After testing, the die is pulled off the die carrier and cleaned to remove residual epoxy, resin or RTV material. The liquid, gel or paste may also be comprised of a water-soluble material that sets up with dehydration. The water-soluble material is applied to the die carrier, and the die is placed on the material. The water-soluble material is then solidified by ambient or heated drying to form a bond between the die carrier and the die. When testing is finished, the water-soluble material may simply be washed away with water and the die removed.

In yet another exemplary embodiment of the present invention, the adhesive material may comprise a volume of solder paste. As is known in the art, solder paste comprises fine particles of metals such as tin and lead which are suspended in a flux carrier. Conventional use of solder paste involves heating it to reflow the particles of metal to a molten state and form a permanent bond between conductive elements. As used in the present invention, solder paste is applied to the die carrier attachment pads, and the die is placed on the solder paste. The solder paste is only heated sufficiently to drive off volatile components of the flux without reflowing the metal particles. In this manner, the solder paste solidifies into a mass of metal particles entrained within dried flux material that bonds the die to the die carrier. As with the above-described water-soluble material, the solder paste is washed away after testing to release the die.

Other and further features and advantages will be apparent from the following detailed description of the present invention when read in conjunction with the accompanying drawings. It should be understood that the embodiments described are provided for illustrative and exemplary purposes only, and that variations to, and combinations of, the several elements and features thereof are contemplated as being within the scope of the invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
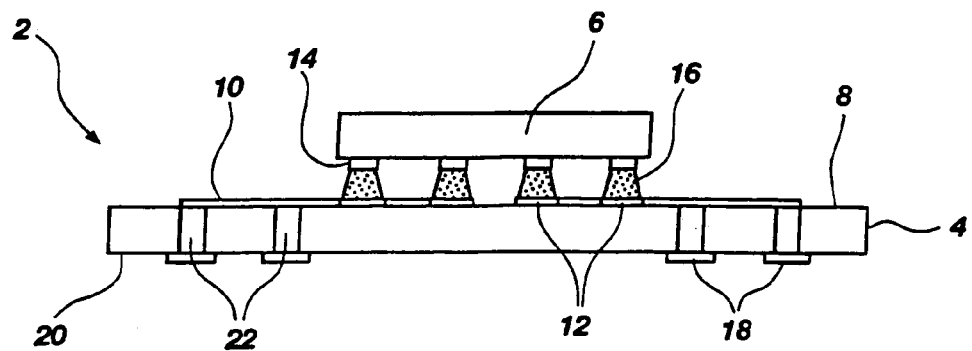
FIG. 1A shows a sectional side view of a die carrier according to the present invention.

Turning initially to the accompanying drawings, die carrier structures and materials and methods for temporarily attaching one or more semiconductor dice thereto are depicted to show various embodiments of the present invention. Common elements of the embodiments are designated with like reference numerals. It should be understood that the drawings are not illustrative of actual views of any particular portion of the actual device structures, but are merely idealized schematic representations which are employed to more clearly and fully depict the invention.

FIG. 1A shows a side view of a die carrier 2 structured for use according to the present invention. In this embodiment, die carrier 2 is shown in a basic form comprised of a substantially planar base substrate 4 configured to hold a single semiconductor die 6. Base substrate 4 includes a die-side surface 8 having a pattern of conductive traces 10 formed thereon. The first ends of traces 10 comprise attachment pads 12 that are positioned on die-side surface 8 in locations corresponding to the pattern of I/O elements 14, such as bond pads or redistributed external contact locations on die 6. The pattern of I/O elements 14 may take the form of one or more spaced rows on the face of die 6. If I/O elements 14 are laid out in a fine pitch pattern used with present circuit densities, for example, they would comprise rows of elements spaced or pitched at intervals of about 0.5 mm or less. Of course, any other arrangement of I/O elements on the face of a semiconductor die may be accommodated by a die carrier according to the present invention.

I/O elements 14 are temporarily secured to attachment pads 12 by an electrically conductive adhesive material 16. The specific features and embodiments of adhesive materials disclosed by the present invention are described in further detail below. As shown in FIG. 1A, I/O elements 14 are depicted as being pad-like LGA structures such as bare die bond pads. It is to be understood, however, that I/O elements 14 may also include structures such as conductive bumps added for subsequent flip-chip or TAB-type circuit connection, and that these structures may be similarly secured by adhesive material 16.

Figure 2:
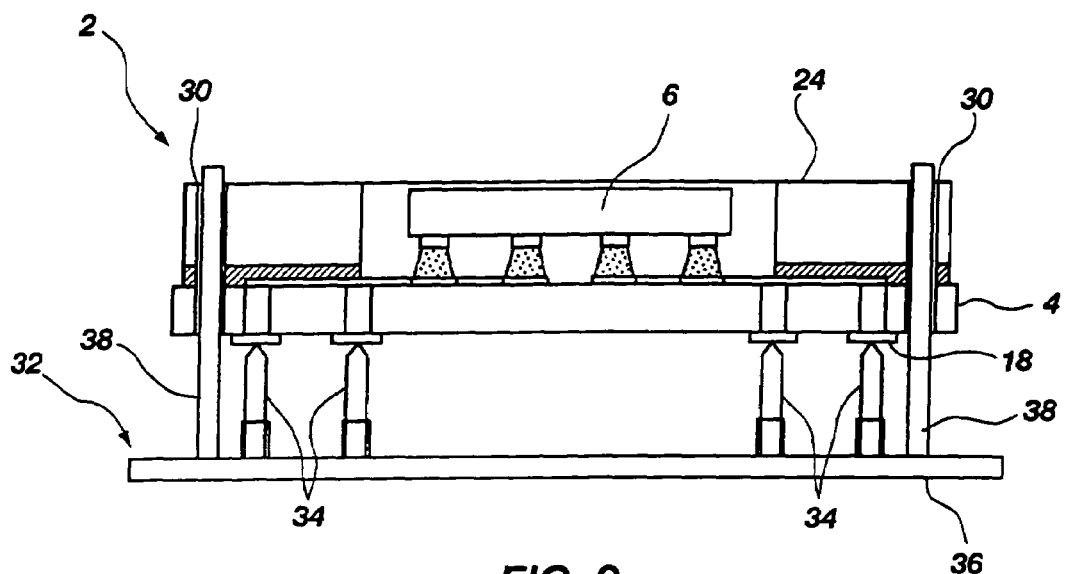
FIG. 2 shows the die carrier depicted in FIG. 1B including alignment features aligned with a probe tester.

FIG. 1A further shows that traces 10 extend from I/O elements 14 to a pattern of contact pads 18 that are sufficiently spaced to interface with a standard matrix of contact probes 34 (FIG. 2). A standard test matrix, for instance, may conventionally have probes spaced at a pitch of about 0.8 mm or greater. In one arrangement, contact pads 18 are formed on a back surface 20 of base substrate 4 and are electrically connected to the second ends of traces 10 by way of conductive vias 22. In this manner, die carrier 2 is configured to be contacted from below, as is often the approach used with conventional test equipment. In another arrangement, contact pads 18' may be formed on die-side surface 8 of base substrate 4, thereby allowing die carrier 2 to be contacted from above. It is further contemplated that in some cases, passive devices 11 (FIG. 3A) may be included on base substrate 4 and connected to traces 10 at points between I/O elements 14 and contact pads 18. When testing high-frequency semiconductor devices, for instance, the added circuit length from traces 10 may generate signal noise that is detrimental to the test results. By including passive devices 11 (e.g., capacitors, resistors or inductors), the signal noise may be reduced or eliminated.

In one presently preferred embodiment of die carrier 2, base substrate 4 comprises a flex circuit formed of a core of one or more sheets of pliant material. As used herein, the term "pliant material" refers to materials that enable base substrate 4 to be bent, twisted or otherwise reshaped from its substantially planar configuration, such as polyimide or polyester materials conventionally known for use in fabricating flex circuits. Traces 10, attachment pads 12 and contact pads 18 may comprise patterned metal or metal alloy foils formed on the surfaces of or within the sheets of pliant material, or may comprise one or more layers of applied conductive polymer materials known for use as conductors in flex circuits. The flex circuit design allows die carrier 2 to be easily fabricated without requiring specialized manufacturing processes associated with the more complex structures of prior art die carriers. Furthermore, it is well known that the product life of a specific semiconductor die layout is relatively short due to constant improvements in technology. In the past, changing the I/O layout of a die required an expensive retooling to provide new die carriers. The low cost of a flex circuit reduces the concerns of having to replace die carriers to accommodate a new die I/O layout.

In some instances, however, process conditions may require base substrate 4 to have a more substantial construction than that offered by a flex circuit. It is, therefore, contemplated that base substrate 4 may be formed as a rigid structure such as a laminated circuit board of, for example, FR-4, FR-5, or BT material.

Figure 1B:
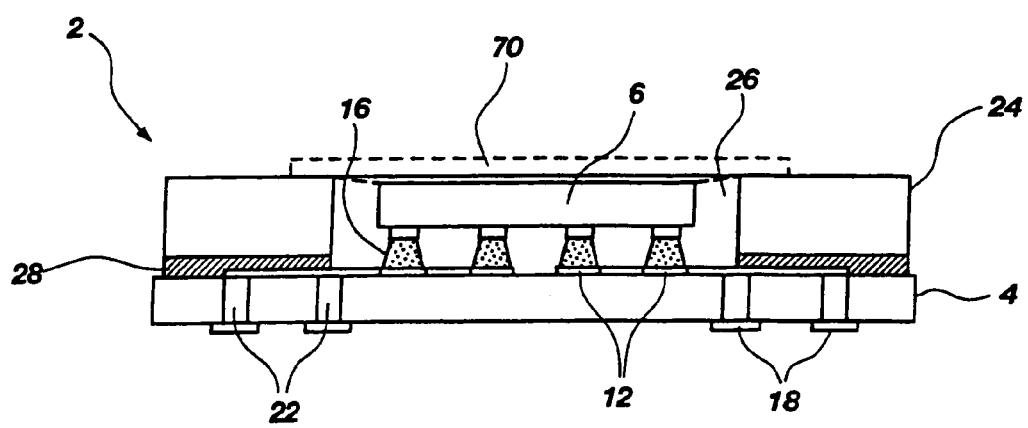
FIG. 1B shows the die carrier depicted in FIG. 1A including a support frame.

According to a further embodiment of the present invention, die carrier 2 includes a support frame 24 as shown in FIG. 1B. Support frame 24 comprises a planar substrate having an aperture 26 that exposes the die attachment area of base substrate 4 and at least partially surrounds the sides of die 6. Support frame 24 is depicted in FIG. 1B as having a thickness that is approximately equal to a thickness of die 6 in order to completely surround its sides within aperture 26. Support frame 24 thereby protects die 6 from being damaged or knocked off of base substrate 4 while being handled. Of course, it is within the scope of the present invention that support frame 24 may have a lesser or greater thickness than that of die 6, if so desired. Support frame 24 may be formed of any material known for use with die carriers or other semiconductor-type fixtures. In the case where base substrate 4 is a flex circuit, support frame 24 should be of a material sufficiently rigid to maintain the planarity of base substrate 4 during handling and testing. When base substrate 4 is constructed of a rigid material, the main function of support frame 24 is to protect the sides of die 6, but it may also offer additional rigidity. Plastics, metals, ceramics, laminated glass composites or other common materials would be suitable for this purpose. Support frame 24 may be temporarily or permanently secured to base substrate 4 by any known means. In FIG. 1B, support frame 24 is depicted as being secured in place by an adhesive layer 28, which may, for example, comprise a dispensed liquid or gel adhesive or a tape or film segment coated on both sides with a suitable adhesive.

Die carrier 2 may also include alignment features 30 that aid its alignment during testing. FIG. 2 shows the function of alignment features 30 when die carrier 2 is seated on a probe tester 32. Probe tester 32 is schematically shown to include a matrix of contact probes 34 carried by a test contactor substrate 36. Contact probes 34 are resiliently biased against contact pads 18 of die carrier 2 to form temporary electrical connections for the testing of die 6. Probe tester 32 further includes alignment pins 38 that extend outwardly from test contactor substrate 36 to a point above contact probes 34. As shown in FIG. 2 alignment features 30, which in this embodiment are apertures passing through base substrate 4 and support frame 24, are seated around alignment pins 38. In this manner, contact pads 18 of die carrier 2 are forced into alignment with contact probes 34. This ensures a good electrical connection will exist for testing die 6. While alignment features 30 are depicted as comprising apertures passing through base substrate 4 and support frame 24, it is to be understood that other configurations are possible and contemplated as being within the scope of the present invention. For instance, alignment features 30 might comprise notches located on the peripheral edge of die carrier 2 that engage alignment pins 38, or may comprise elements that protrude from die carrier 2 and mate with holes formed in test contactor substrate 36.

Figure 3A:
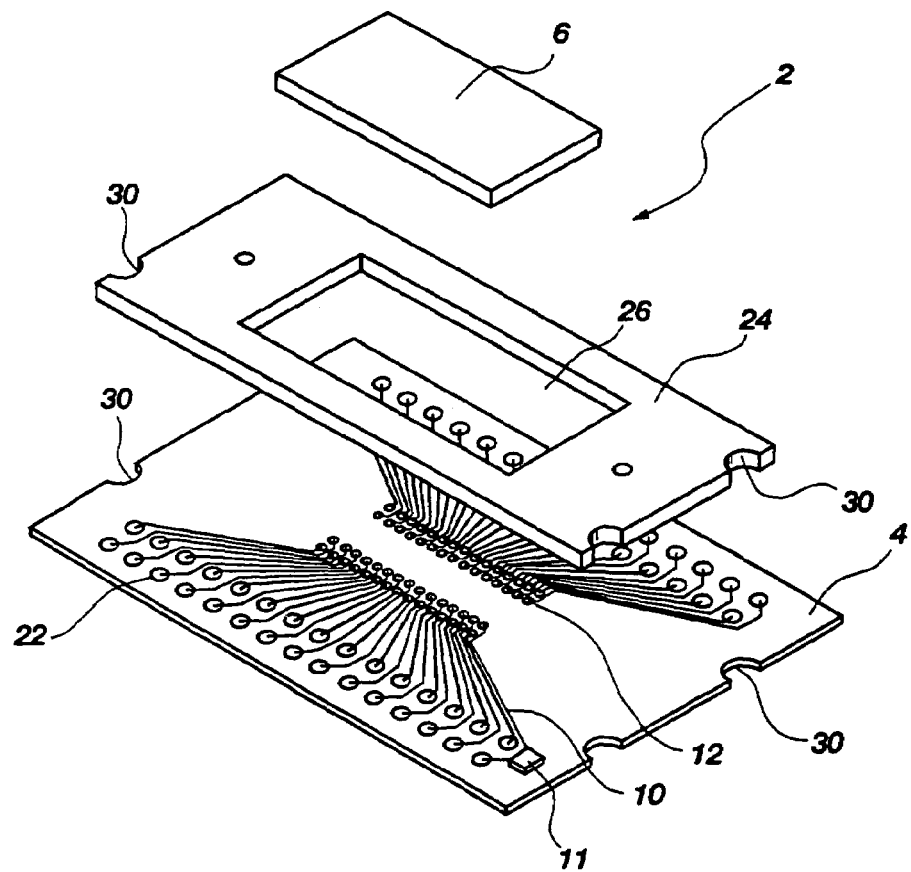
FIG. 3A shows an exploded perspective view of a die carrier.
Figure 3B:
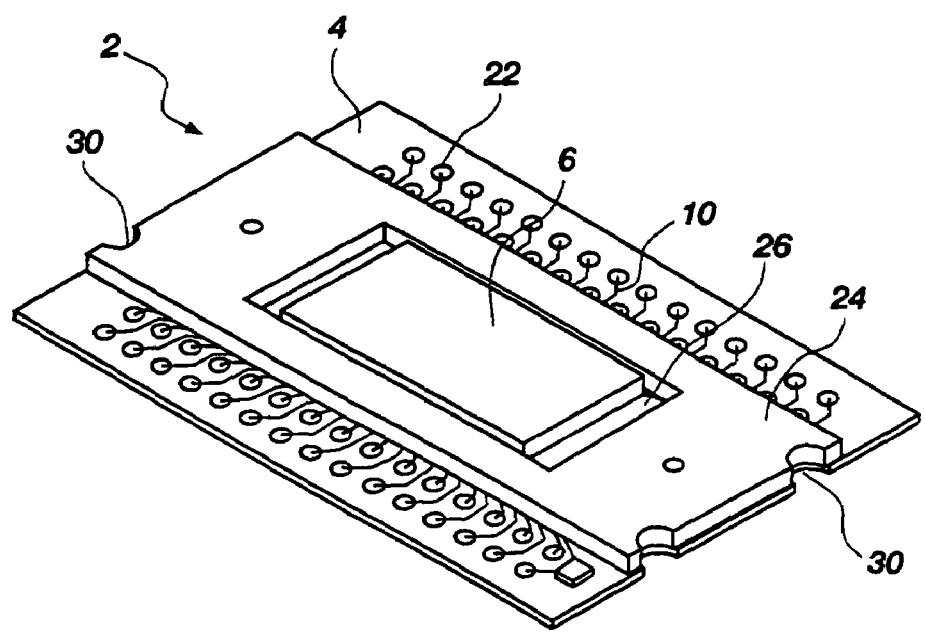
FIG. 3B shows a perspective view of the die carrier depicted in FIG. 3A with the support frame and semiconductor die secured to the base substrate.

FIG. 3A shows an exploded perspective view of die carrier 2 having base substrate 4 and support frame 24 for surrounding die 6. As depicted in FIG. 3A, base substrate 4 is configured with traces 10 fanning out from four rows of attachment pads 12 to four rows of conductive vias 22 overlying contact pads 18 (not shown). A passive device 11 is also shown on base substrate 4 as being connected to a trace 10 for reducing or eliminating signal noise. In this embodiment of die carrier 2, alignment features 30 comprise notches formed on the peripheral edges of base substrate 4 and support frame 24. FIG. 3B shows support frame 24 secured to base substrate 4 and die 6 attached to die carrier 2 within aperture 26.

FIGS. 3A and 3B highlight the utility of using die carrier 2 for testing of semiconductor dice having very fine pitch I/O elements. By spreading out the location of contact pads 18 (see FIG. 1B), smaller and more fragile contact probes are not required to match up with the layout of I/O elements 14 on die 6. Instead, conventional test equipment with conventionally sized and pitched contact probes may be utilized. FIGS. 3A and 3B also highlight the benefit of using a flex circuit for base substrate 4. Because support frame 24 does not overlie the location of contact pads 18, a flex circuit base substrate 4 may yield slightly when pressed on by contact probes 34. This reduces the stress on the test equipment. Furthermore, in embodiments of die carrier 2 where at least some of contact pads 18 are located under die 6, base substrate 4 will be pushed towards I/O elements 14, thereby improving the electrical connection through adhesive material 16.

Figure 4A:
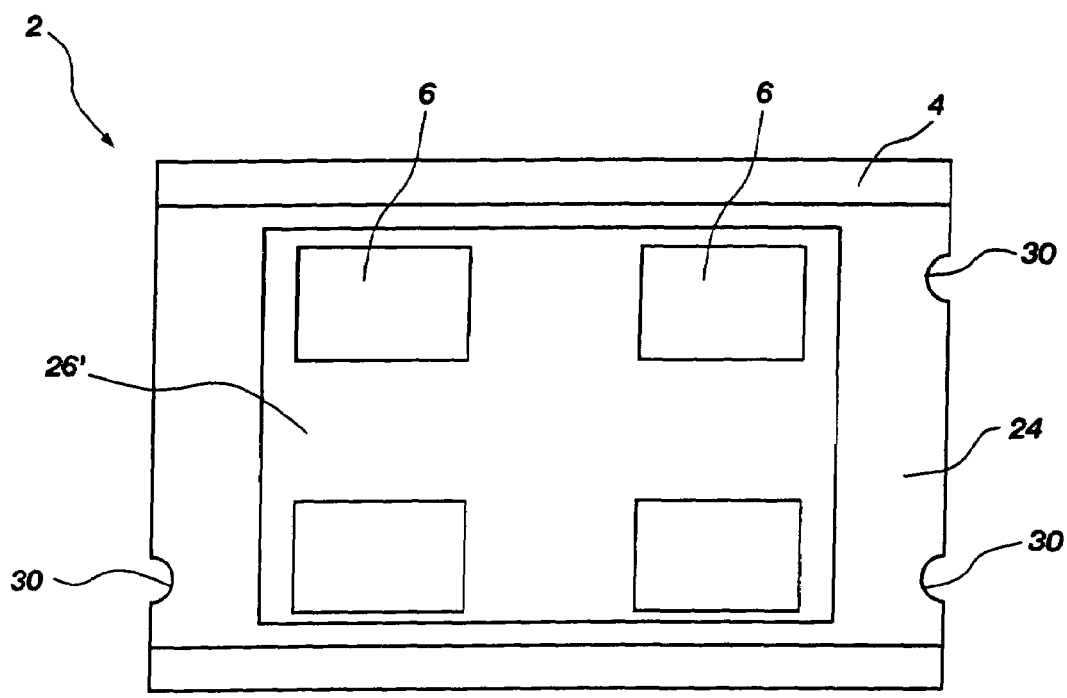
FIG. 4A shows a top view of a die carrier for multiple dice including a support frame with a single aperture of a size sufficient to at least partially surround all of the multiple dice.
Figure 4B:
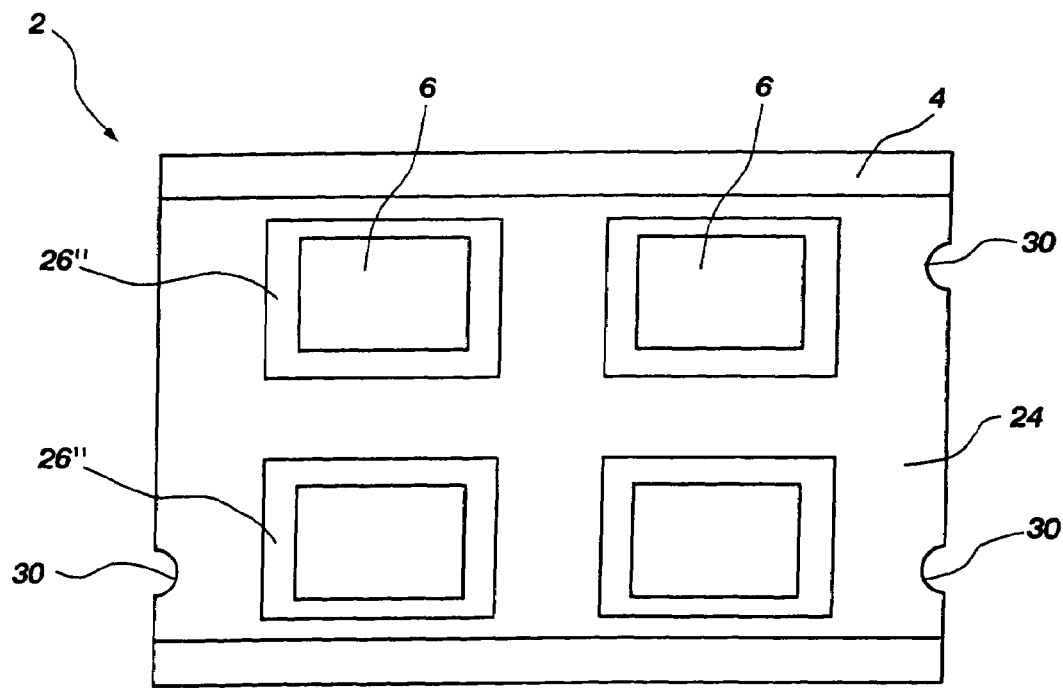
FIG. 4B shows a top view of a die carrier for multiple dice including a support frame having multiple apertures for at least partially surrounding each die of the multiple dice.

While FIGS. 1A–3B have depicted die carrier 2 as holding a single semiconductor die 6, it is also contemplated that die carrier 2 may be formed to accommodate multiple dice for simultaneous testing. Base substrate 4 would simply be formed with attachment pads, traces and contact pads corresponding to the I/O elements of multiple dice. Support frame 24 may be provided with an aperture 26' of sufficient size to at least partially surround all the dice 6, as shown in FIG. 4A, or may be provided with multiple apertures 26", each aperture sized to at least partially surround one or more of the dice 6, as shown in FIG. 4B. Alternatively, multiple die carriers, each for holding a single semiconductor die, may be placed into a matrix-type fixture and lowered onto an array of sockets on a test board. Each of the die carriers could be directly contacted by the test equipment through the fixture, or the fixture itself could include conductive elements providing electrical communication between the test equipment and the die carriers.

Further advantages over the prior art result from the novel materials and methods disclosed by the present invention for temporarily attaching semiconductor dice to a die carrier. FIGS. 5–9 show the specific features and embodiments of adhesive materials as used in conjunction with the above-described die carrier 2. However, it is also believed that some of the disclosed adhesive materials have not heretofore been used for forming a temporary electrical connection between a semiconductor die and any higher-level assembly and are, therefore, in and of themselves inventive.

Figure 5:
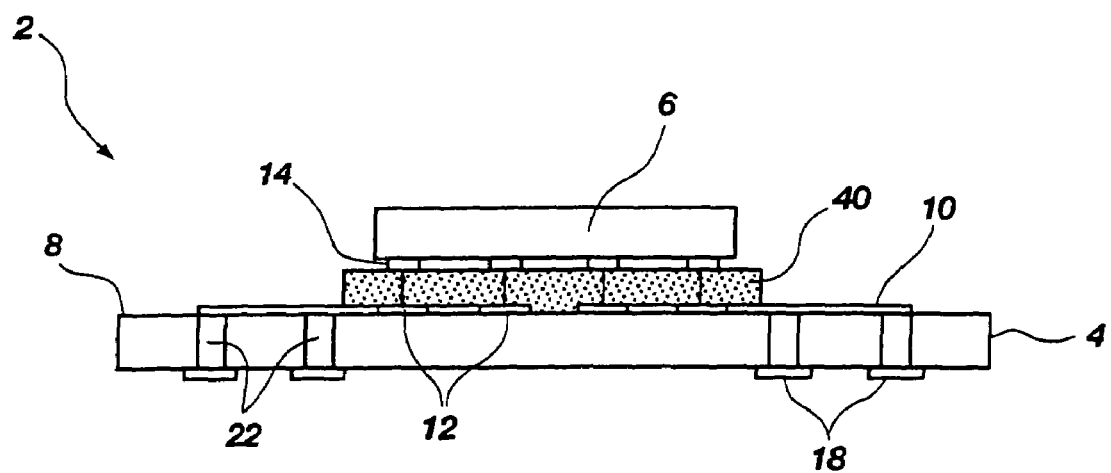
FIG. 5 shows a die carrier with a conductive film or adhesive tape for attaching a semiconductor die.

In one embodiment of the present invention, the adhesive material comprises an electrically conductive film or adhesive tape 40. FIG. 5 shows adhesive tape 40 applied to the die-side surface 8 of die carrier 2 over attachment pads 12. Adhesive tape 40 electrically connects attachment pads 12 on one side thereof to I/O elements 14 of die 6 on the other side thereof by anisotropic, or z-axis, conduction. As shown in FIG. 5, because adhesive tape 40 only conducts in a direction perpendicular to its two sides (illustrated by arrows in adhesive tape 40), a single piece of tape may be applied between attachment pads 12 and I/O elements 14 without any shorting occurring between adjacent locations. After testing, die 6 would be removed from die carrier 2 in a manner similar to that known for removing a die from a dicing frame after wafer singulation. In this process, heat is applied to adhesive tape 40 to loosen the bond with die 6, and a vacuum chuck lifts die 6 off of adhesive tape 40. When base substrate 4 comprises a flex circuit, force may also be applied to die carrier 2 underneath die 6 to assist in breaking the bond.

Adhesive tape 40 may further comprise a pressure-sensitive z-axis conductive adhesive tape that only conducts when pressure is applied. This may be beneficial, especially when base substrate 4 comprises a flex circuit, in that adhesive tape 40 will not provide an electrical connection until it is pressed on during testing. Die 6 will, therefore, be electrically isolated when handling die carrier 2 outside of testing, and the risk of damage to die 6 from static charges known to build up in the processing environment will be avoided. Conductive films and adhesive tapes of the type described are known in the art and are commercially available from vendors such as 3M Corporation of St. Paul, Minn. under the product name Z-Axis Adhesive Film 5303R-1, as well as Sheldahl, Inc. of Northfield, Minn., under the product name Z-Link.

In another embodiment, the adhesive material comprises an electrically conductive liquid, gel or paste. The liquid, gel or paste is applied to each of the attachment pads 12 of die carrier 2, as generally shown by adhesive material 16 in FIGS. 1A and 1B. One material suitable for this embodiment is a conductive or conductor-filled resin or epoxy. Conductive resins and epoxies have conventionally been used in semiconductor manufacturing to permanently bond die I/O elements to higher-level assemblies. This is accomplished by curing the resins and epoxies after die attachment to form a solidified conductive bond between the die I/O elements and conductive elements of the higher-level assemblies. When used in conjunction with the present invention, the resin or epoxy may be similarly cured to form a solidified conductive bond between attachment pads 12 and I/O elements 14. After testing, the bond would be broken by a solvent or deactivating agent to allow removal of die 6 from die carrier 2. The specific solvent or deactivating agent would be based on the composition of the resin or epoxy used to bond I/O elements 14 to attachment pads 12. A suitable solvent might comprise, for example, an alcohol-based fluid capable of breaking down the epoxy or resin in a solvent bath. When using a thermoplastic resin or epoxy, on the other hand, a deactivating agent might comprise heat applied to the resin or epoxy after testing.

Another suitable material for this embodiment is a room temperature vulcanized (RTV) adhesive of silicon or similar materials, an example of which is commercially available from Henkel Loctite Corp. of Rocky Hill, Conn., under the product name 5421. Electrically Conductive Adhesive. The RTV adhesive may be impregnated with conductive particles such as powdered silver, which would then provide a conductive bond between attachment pads 12 and I/O elements 14. RTV adhesive adheres well to tin/lead coatings that may be commonly used to cover circuit elements such as attachment pads 12, while these adhesives are less adherent to gold, which is often used for die structures such as I/O elements 14. Using an adhesive with this characteristic may simplify removal of die 6 after testing because bond separation of the cured I/O adhesive would be more likely to occur at the interface with I/O elements 14.

In an alternative to the above embodiments, if the resin, epoxy or RTV adhesive provides sufficient adhesion in an uncured or partially cured (B-stage) state, die 6 may be held in place during testing without completely curing the resin, epoxy or RTV adhesive into a solidified bond. After testing, die 6 could then simply be pulled off of die carrier 2 without requiring further processing to break a solidified bond between I/O elements 14 and attachment pads 12. Cleaning of residual resin, epoxy or RTV adhesive from I/O elements 14 might be required after separation of die 6 from die carrier 2, but this process would be much less labor intensive than having to use a solvent or deactivating agent to break a solidified bond.

Figure 6:
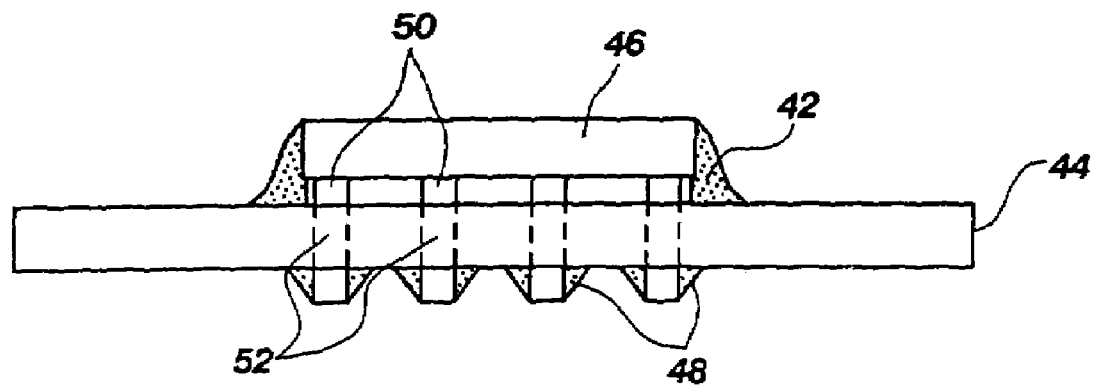
FIG. 6 shows a water-soluble mask as conventionally used to hold through-hole electronic components.

It is also envisioned that the adhesive material in liquid, gel or paste form may comprise a water-soluble material that sets up with dehydration. In the prior art, similar water-soluble mask materials have been used to hold through-hole electronic components onto circuit boards during wave soldering operations. FIG. 6 shows how a mask material 42 is conventionally applied in the form of a liquid, gel or paste to the surface of a circuit board 44 along the sides of a through-hole component 46. Mask material 42 is then solidified by ambient or heated drying such that component 46 is bonded to circuit board 44. The entire assembly is passed through a wave solder machine, thereby forming solder joints 48 between the leads 50 of component 46 and through-holes 52 in circuit board 44. Mask material 42 is thereafter removed by washing it away with water. Water-soluble mask materials used for this purpose are commercially available from several vendors, and are typically formulated from polymer and/or copolymer materials mixed with an organic solvent such as an alcohol. Contronic Devices Inc. of Huntington Beach, Calif., for instance, offers liquid- or paste-type masks under the product names "WSM-90T Comp Hold" and "NI Comp Hold 60LH." Kester Company of Des Plaines, Ill., also offers a similar water-soluble mask under the product name TC-564-1.

These water-soluble masks are not formulated to be conductive in nature, and it is believed that they have not previously been contemplated for use in providing temporary electrical connections. According to the present invention, a water-soluble material, such as the above-described component masks, is made conductive by impregnating it with a filler of conductive material particles. This is similar to methods used for making conductive epoxies, wherein very fine particles of silver or other conductive materials are added to provide conductive pathways through the epoxy structure.

Figure 7:
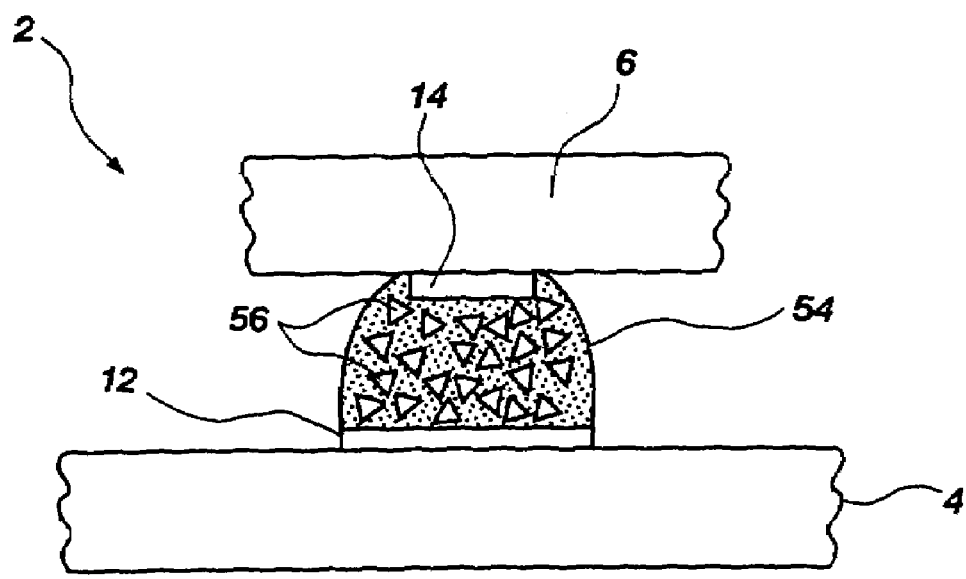
FIG. 7 shows a schematic view of a water-soluble bond used to provide a temporary electrical connection according to the present invention.

FIG. 7 shows the structure of a water-soluble material 54 used in the present invention to provide a temporary electrical connection between attachment pads 12 of die carrier 2 and I/O elements 14 of die 6. In this attachment method, water-soluble material 54 is impregnated with conductive particles 56 and applied to each of attachment pads 12. Conductive particles 56 may comprise a powdered metal, such as silver or lead or any other conductive material that may be entrained within water-soluble material 54. I/O elements 14 of die 6 are placed into contact with water-soluble material 54, which is subsequently dehydrated to form a solid bond securing die 6 to die carrier 2. Depending on the composition of water-soluble material 54, it may simply be dried over time in the ambient environment or dried under elevated temperatures. Adjacent, mutually contacting conductive particles 56 form conductive pathways through water-soluble material 54, thereby providing a temporary electrical connection between attachment pads 12 and I/O elements 14. When testing has been completed, water-soluble material 54 is dissolved with water to release die 6 from die carrier 2.

Figure 8A:
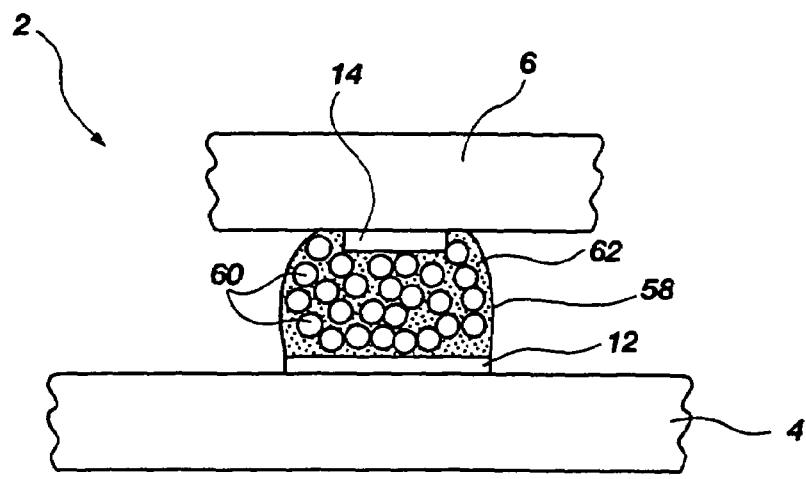
FIG. 8A shows a schematic view of a solder paste bond used to provide a temporary electrical connection with a pad-like structure.

In another embodiment of the present invention, solder paste is used to attach die 6 to die carrier 2. FIG. 8A shows the structure of a volume of solder paste 58 acting as the adhesive material for bonding I/O elements 14 to attachment pads 12. As known in the art, solder paste 58 comprises fine metal particles or spheres 60, such as tin and lead, suspended in a flux carrier 62. Solder pastes of this type are commercially available from vendors such as Kester Company of Des Plaines, Ill. Flux carrier 62 initially comprises a semi-fluid media, typically resin-based with a volatile organic solvent. In the present attachment method, solder paste 58 is applied to each of attachment pads 12, and I/O elements 14 of die 6 are placed on top of solder paste 58. Solder paste 58 is only heated to a point where the volatile solvent component of flux carrier 62 evaporates without any melting of metal spheres 60. In this manner, flux carrier 62 sets up into a solidified structure that entrains metal spheres 60 and is adhered to attachment pads 12 and I/O elements 14. Adjacent, mutually contacting metal spheres 60 form conductive pathways through solder paste 58, thereby providing a temporary electrical connection between attachment pads 12 and I/O elements 14. As with the above-described water-soluble material 54, once testing is complete, solder paste 58 is washed away to release die 6 from die carrier 2. The wash medium may be water or some other solvent, such as alcohol, suitable for dissolving the composition of flux carrier 62.

Figure 8B:
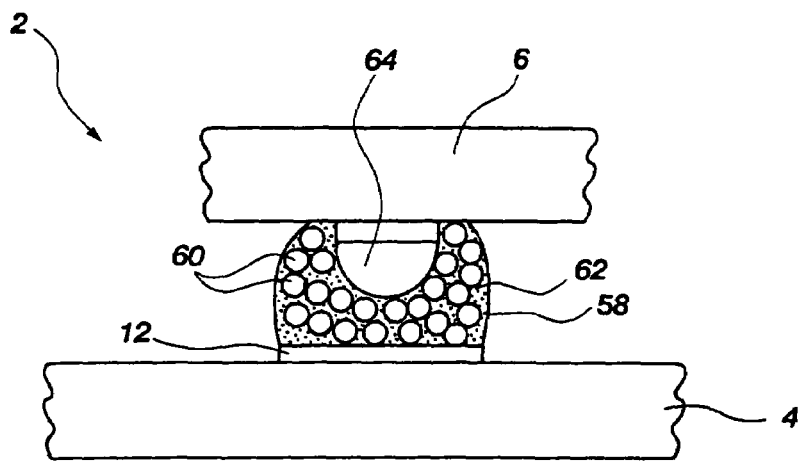
FIG. 8B shows a schematic view of a solder paste bond used to provide a temporary electrical connection with a conductive bump.

FIG. 8B shows an embodiment using solder paste 58 as an adhesive material wherein I/O elements 14 are not pad-like structures, but rather comprise conductive bumps 64 that are used for flip-chip or TAB connection. Under this embodiment, conductive bumps 64 are pressed down into solder paste 58 such that metal spheres 60 and flux carrier 62 are forced up around the sides of conductive bumps 64. The heating of flux carrier 62 into a solidified structure is then carried out in the same manner as described with pad-like I/O elements.

Although the present invention has been described with respect to the illustrated embodiments, various additions, deletions and modifications are contemplated as being within its scope. For instance, die carrier 2 may have a perimeter shape other than rectangular, or may be dimensioned to fit into standardized handling trays used for transportation of dice between equipment locations. Likewise, while support frame 24 has been depicted in FIGS. 1A–3B as having a specific size in relation to base substrate 4, any other dimensions are possible. Support frame 24 may extend beyond the edges of base substrate 4 or might be comprised of separate elements attached to isolated portions of base substrate 4.

Furthermore, as stated above, the adhesive materials and methods disclosed by the present invention may be used for providing a temporary electrical connection between electronic devices other than when attaching a semiconductor die to a die carrier. It is also contemplated that an adhesive material may be used for temporarily attaching a semiconductor die to the die carrier without providing an electrical connection. For example, an adhesive tape may simply be placed over the support frame aperture to hold or assist in holding a die in place during testing. As shown by dashed lines in FIG. 1B, a section of adhesive tape 70 is placed across aperture 26 in support frame 24 and holds die 6 in contact with attachment pads 12.

Figure 9:
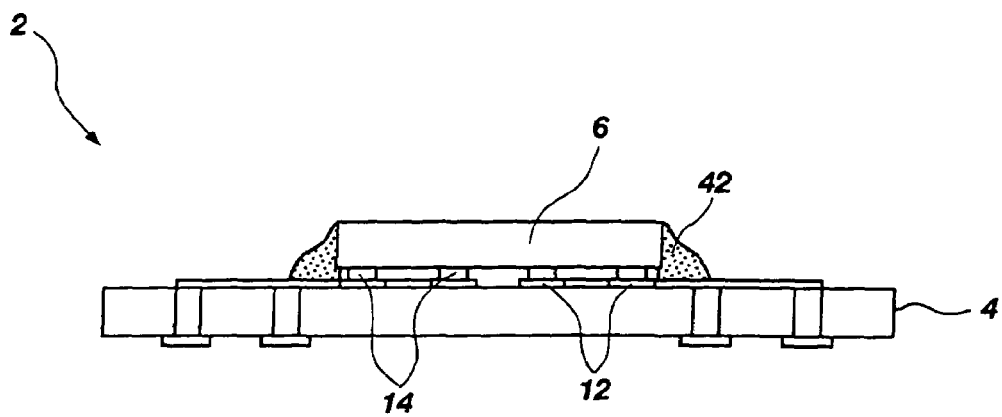
FIG. 9 shows a semiconductor die bonded to a die carrier with a water-soluble material deposited around a peripheral edge of the semiconductor die.

Likewise, the above-described water-soluble mask material 42 may be used without any conductive filler and placed around the periphery of die 6 to hold I/O elements 14 against attachment pads 12 on base substrate 4 during testing, as shown in FIG. 9. Similar to the above-described wave soldering operations, mask material 42 is solidified by ambient or heated drying such that die 6 is bonded to base substrate 4. Die 6 is tested, and mask material 42 is thereafter removed by washing it away with water.

The scope of the present invention is, therefore, indicated by the appended claims, rather than the foregoing description. All changes which come within the meaning and range of equivalency of the claims are to be embraced within their scope.

What is claimed is:

1. A method for temporarily conductively bonding circuit assemblies comprising:
   providing an electronic device including a first conductive element;
   providing a substrate including a second conductive element;
   applying a conductive material including an aqueous solvent and a water soluble material impregnated with a conductive filler comprising discrete particles to at least one of the first conductive element and the second conductive element;
   dehydrating the conductive material to a degree sufficient to provide an at least partially solidified bond between the first conductive element and the second conductive element without substantially removing or degrading the water-soluble material; and
   removing the conductive material to release the at least one electronic device from the substrate.

2. The method of claim 1, further comprising forming the conductive filler of the water-soluble material from discrete particles of a metal or metal alloy.

3. The method of claim 1, further comprising selecting the water-soluble material to comprise a polymer or copolymer-based material.

4. The method of claim 1, wherein providing an electronic device comprises providing a semiconductor die.

5. The method of claim 4, further comprising probing a third conductive element on the substrate to test a functional aspect of the semiconductor die.

6. A method for temporarily conductively bonding circuit assemblies comprising:
   providing an electronic device including a first conductive element;
   providing a substrate including a second conductive element;
   applying a solder paste having discrete particles of a metal or metal alloy entrained within a soluble flux carrier to at least one of the first conductive element and the second conductive element;
   heating the solder paste to provide an at least partially solidified solder paste structure comprising the discrete particles of a metal or metal alloy entrained within a remaining, non-solvent portion of the soluble flux carrier, wherein the at least partially solidified solder paste structure forms a bond between the first conductive element and the second conductive element; and
   removing the solder paste to release the at least one electronic device from the substrate.

7. The method according to claim 6, wherein heating the solder paste comprises driving off volatiles in the soluble flux carrier while maintaining the particles of a metal or metal alloy in a solid state within a matrix of remaining material of the soluble flux carrier.

8. The method of claim 6, wherein providing an electronic device comprises providing a semiconductor die.

9. The method of claim 6, further comprising probing a third conductive element on the substrate to test a functional aspect of the electronic device.

* * * * *

UNITED STATES PATENT AND TRADEMARK OFFICE
CERTIFICATE OF CORRECTION

| | |
|---|---|
| PATENT NO. | : 7,122,389 B2 |
| APPLICATION NO. | : 10/920014 |
| DATED | : October 17, 2006 |
| INVENTOR(S) | : Steven L. Hamren and Daniel P. Cram |

It is certified that error appears in the above-identified patent and that said Letters Patent is hereby corrected as shown below:

On the title page:
In the section (56) References Cited,
U.S. PATENT DOCUMENTS,
2nd page, 2nd column, 2nd entry    change "6,529,145 B1 3/2003 Lin" to
--6,528,145 B1 3/2003 Berger et al.--

In the specification:
    COLUMN 2, LINE 7,    change "die I/0 elements" to
--die I/O elements--

Signed and Sealed this

Twentieth Day of November, 2007

JON W. DUDAS
*Director of the United States Patent and Trademark Office*